(12) United States Patent
Ono (10) Patent No.: US 9,300,019 B2
(45) Date of Patent: Mar. 29, 2016

(54) HIGH-FREQUENCY MODULE

(71) Applicant: Murata Manufacturing Co., Ltd., Nagaokakyo-shi, Kyoto-fu (JP)

(72) Inventor: Atsushi Ono, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 228 days.

(21) Appl. No.: 14/016,422

(22) Filed: Sep. 3, 2013

(65) Prior Publication Data

US 2014/0002209 A1   Jan. 2, 2014

Related U.S. Application Data

(63) Continuation of application No. PCT/JP2012/057122, filed on Mar. 21, 2012.

(30) Foreign Application Priority Data

Mar. 24, 2011   (JP) ................. 2011-065149

(51) Int. Cl.
*H01P 1/10* (2006.01)
*H04B 1/00* (2006.01)
(Continued)

(52) U.S. Cl.
CPC ............. *H01P 1/10* (2013.01); *H01P 1/2135* (2013.01); *H04B 1/0057* (2013.01); *H04B 15/00* (2013.01); *H05K 1/0225* (2013.01); *H05K 1/0243* (2013.01); *H05K 1/165* (2013.01)

(58) Field of Classification Search
CPC ........ H04B 1/0057; H04B 1/48; H04B 1/006; H03H 7/463; H03H 2001/0085; H03H 9/725; H01L 24/30
USPC .................. 333/101, 245, 247, 262
See application file for complete search history.

(56) References Cited

U.S. PATENT DOCUMENTS 6,995,630 B2 *   2/2006   Satoh ................ H04B 1/52
                                                                333/101
7,242,268 B2    7/2007   Hagiwara et al.
(Continued)

FOREIGN PATENT DOCUMENTS

CN       1875549 A     12/2006
CN     101123446 A      2/2008
(Continued)

OTHER PUBLICATIONS

Official Communication issued in International Patent Application No. PCT/JP2012/057122, mailed on Apr. 24, 2012.
Official Communication issued in corresponding German Patent Application No. 11 2012 001 397.2, mailed on Dec. 12, 2014.

*Primary Examiner* — Dean Takaoka
*Assistant Examiner* — Alan Wong
(74) *Attorney, Agent, or Firm* — Keating & Bennett, LLP (57) ABSTRACT

A multilayer substrate includes therein wiring conductors, ground conductors, interlayer connection conductors, and a matching inductor. A control signal input terminal is provided on a second main surface of the multilayer substrate. Electrodes on which a high-frequency switch is mounted are electrically connected to the wiring conductors through the interlayer connection conductors. The control signal wiring conductor is located on a dielectric layer close to the second main surface of the multilayer substrate, and the high-frequency signal wiring conductor is located on a dielectric layer close to a first main surface of the multilayer substrate. The ground conductor, which is superposed with the control signal wiring conductor in plan view is separated from the matching device conduction ground conductor by a separation portion. With this structure, influence of harmonic noise due to input of high-frequency switch control signals is reduced and degradation of the communication characteristics is reduced.

20 Claims, 11 Drawing Sheets

(51) Int. Cl.
  *H05K 1/02*   (2006.01)
  *H05K 1/16*   (2006.01)
  *H01P 1/213*  (2006.01)
  *H04B 15/00*  (2006.01)

(56) References Cited

U.S. PATENT DOCUMENTS

| | | | |
|---|---|---|---|
| 8,368,484 B2 * | 2/2013 | Uejima | H03H 7/463 |
| | | | 333/101 |
| 8,803,632 B2 * | 8/2014 | Takeuchi | 333/101 |
| 8,804,362 B2 * | 8/2014 | Uejima | H04B 1/006 |
| | | | 361/600 |
| 2004/0032706 A1 | 2/2004 | Kemmochi et al. | |
| 2004/0130388 A1 | 7/2004 | Block et al. | |
| 2008/0032635 A1 | 2/2008 | Yang et al. | |
| 2009/0075604 A1 | 3/2009 | Furutani et al. | |
| 2010/0061071 A1 | 3/2010 | Watanabe | |
| 2010/0062727 A1 | 3/2010 | Kemmochi et al. | |
| 2014/0091877 A1 * | 4/2014 | Uejima | H03H 9/0576 |
| | | | 333/133 |

FOREIGN PATENT DOCUMENTS

| | | | |
|---|---|---|---|
| JP | 63-79350 A | | 4/1988 |
| JP | 2002-208868 A | | 7/2002 |
| JP | 2004-260498 A | | 9/2004 |
| JP | 2009-153208 A | | 7/2009 |
| JP | 4337009 B2 | | 9/2009 |
| JP | 2010-161812 A | | 7/2010 |
| JP | 2010-263311 A | | 11/2010 |
| WO | 02/058239 A2 | | 7/2002 |
| WO | 2007/049788 A1 | | 5/2007 |
| WO | WO 2010053131 A1 * | | 5/2010 |

* cited by examiner

HIGH-FREQUENCY MODULE

BACKGROUND OF THE INVENTION

1. Field of the Invention

The present invention relates to high-frequency modules having a configuration in which a high-frequency switch and a high-frequency filter are mounted on a multilayer substrate, and specifically to high-frequency modules including a control signal input terminal to which a control signal for a high-frequency switch is input.

2. Description of the Related Art

In general, a front-end module is provided between an antenna and a transmitter/receiver circuit in a communication apparatus that performs communication by switching among a plurality of communication frequency bands. For example, Japanese Unexamined Patent Application Publication No. 2004-517583 discloses a front-end module including a high-frequency switch.

Figure 1:
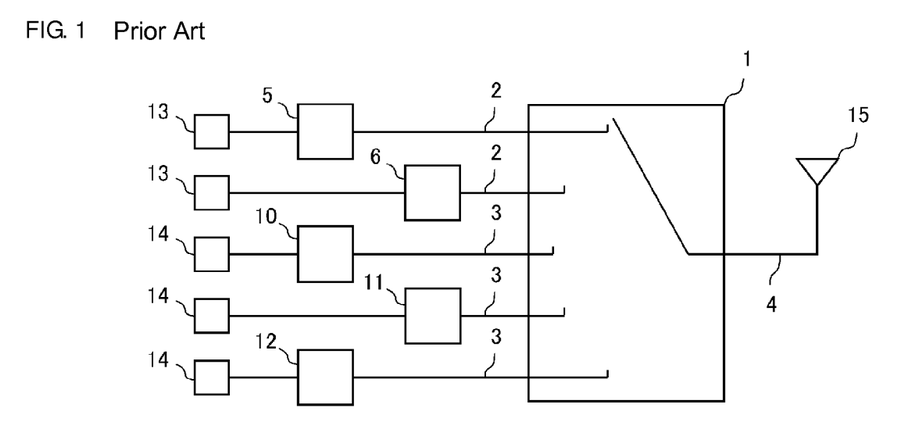
FIG. 1 is a circuit diagram of a front-end module illustrated in Japanese Unexamined Patent Application Publication No. 2004-517583.

FIG. 1 is a circuit diagram of the front-end module illustrated in FIG. 1 of Japanese Unexamined Patent Application Publication No. 2004-517583. In this front-end module, transmission signal input portions 2 of a high-frequency switch 1 are connected to power amplifiers 13 through low pass filters 5 and 6. Reception signal output portions 3 are connected to low-noise amplifiers 14 through band pass filters 10, 11, and 12. An output portion 4 of the high-frequency switch 1 is connected to an antenna 15.

A small high-frequency module can be formed by mounting a high-frequency switch such as the one illustrated in Japanese Unexamined Patent Application Publication No. 2004-517583 on a multilayer ceramic substrate together with a diplexer and a filter. However, unless a well-designed arrangement of wiring patterns including surface electrodes of the multilayer substrate is used, there arises a problem of interference among wiring lines. In particular, in the case of a high-frequency switch that receives control data using a serial data signal and a clock signal, since the serial data signal and clock signal (high-frequency switch control signals) include many harmonic noise components, it is difficult to design the wiring for the high-frequency switch control signals.

The above problem arises not only in interference generated between the filter and the high-frequency switch but also in interference generated between the antenna and the high-frequency switch.

SUMMARY OF THE INVENTION

In view of the above situation, preferred embodiments of the present invention provide a high-frequency module in which degradation in communication characteristics has been reduced by reducing the influence of harmonic noise due to high-frequency switch control signals.

As a result of study through experiments performed by the inventor of the present invention, it was discovered that harmonic noise due to high-frequency switch control signals is superimposed on the high-frequency signal line of a high-frequency switch through a ground conductor layer within a multilayer substrate, and that the superimposition is caused by the fact that a control signal wiring conductor and a wiring conductor through which a high-frequency signal of the high-frequency switch flows are close to the same ground conductor. Further, when an electronic component other than the high-frequency switch is provided, harmonic noise due to the high-frequency switch control signals is superimposed on a ground conductor that is electrically connected to the electronic component through a ground conductor layer within the multilayer substrate, and the superimposition is caused by the fact that the ground conductor (matching device conduction ground conductor) electrically connected to the electronic component is close to the control signal wiring conductor.

In view of the above-described problems, a high-frequency switch module according to a preferred embodiment of the present invention is preferably configured as follows.

According to a preferred embodiment of the present invention, a high-frequency module includes a multilayer substrate including a plurality of dielectric layers, wiring conductors located on dielectric layers, and interlayer connection conductors extending through dielectric layers in a thickness direction; a high-frequency switch and an electronic component mounted on a first main surface of the multilayer substrate; and a control signal input terminal that is located on a second main surface of the multilayer substrate and that receives a control signal for the high-frequency switch, wherein a control signal wiring conductor connected to the control signal input terminal is located on a dielectric layer close to the second main surface of the multilayer substrate, and a high-frequency signal wiring conductor through which a high-frequency signal of the high-frequency switch flows is located on a dielectric layer close to the first main surface of the multilayer substrate.

It is preferable that an electronic component conduction ground conductor connected to a ground terminal of the electronic component is located on a dielectric layer close to the first main surface of the multilayer substrate.

It is preferable that a ground conductor close to the control signal wiring conductor and the electronic component conduction ground conductor is electrically separated from each other within the multilayer substrate.

It is preferable that another ground conductor other than the electronic component conduction ground conductor is provided between the control signal wiring conductor and the electronic component conduction ground conductor.

It is preferable that an interlayer connection conductor electrically connecting the high-frequency switch to the control signal wiring conductor is located in a region of the high-frequency switch when the multilayer substrate is viewed in plan.

It is particularly effective to use a configuration in which the control signal for the high-frequency switch received by the high-frequency switch from the control signal input terminal includes a serial data signal and a clock signal.

The electronic component preferably is a matching device connected between the high-frequency signal wiring conductor and ground.

The matching device preferably is an inductor device includes an interlayer connection conductor and a wiring conductor within the multilayer substrate.

The matching device preferably is an inductor device mounted on the first main surface of the multilayer substrate.

According to various preferred embodiments of the present invention, electromagnetic coupling between the control signal wiring conductor and the high-frequency signal wiring conductor and electromagnetic coupling between the control signal wiring conductor and the matching device conduction ground conductor are suppressed or prevented, such that the influence of harmonic noise due to input of a high-frequency switch control signal is significantly reduced. As a result, degradation of the communication characteristics, such as a decrease in reception sensitivity and distortion of a transmission signal, is significantly reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 2A:
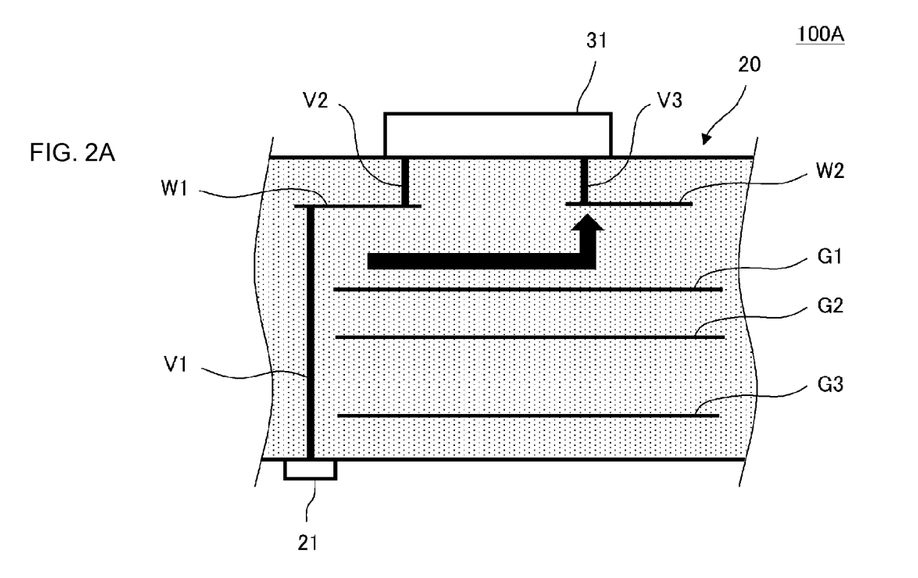
FIG. 2A and FIG. 2B are sectional views of the major portions of high-frequency modules 100A and 100B, which are comparative examples of a high-frequency module of a first preferred embodiment of the present invention.
Figure 2B:
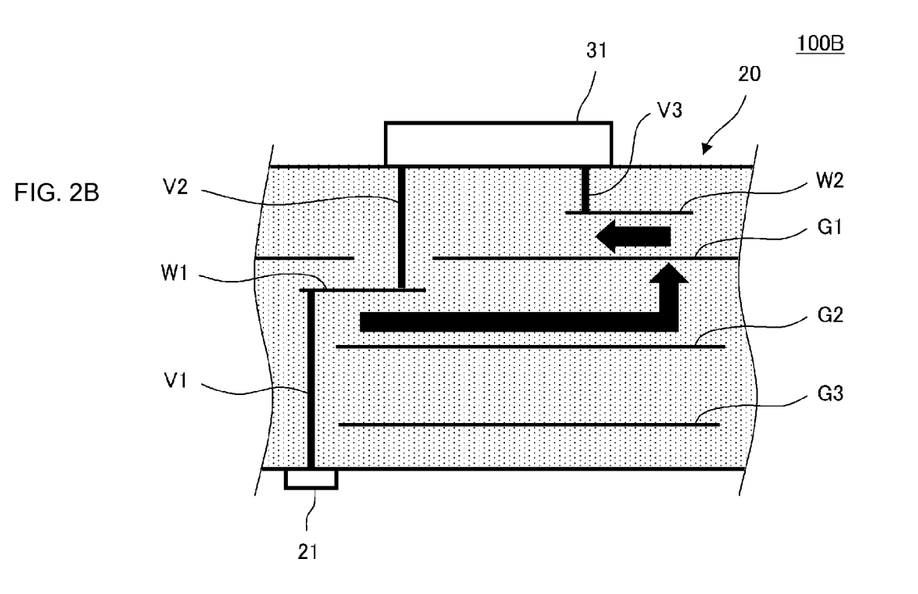
Figure 3:
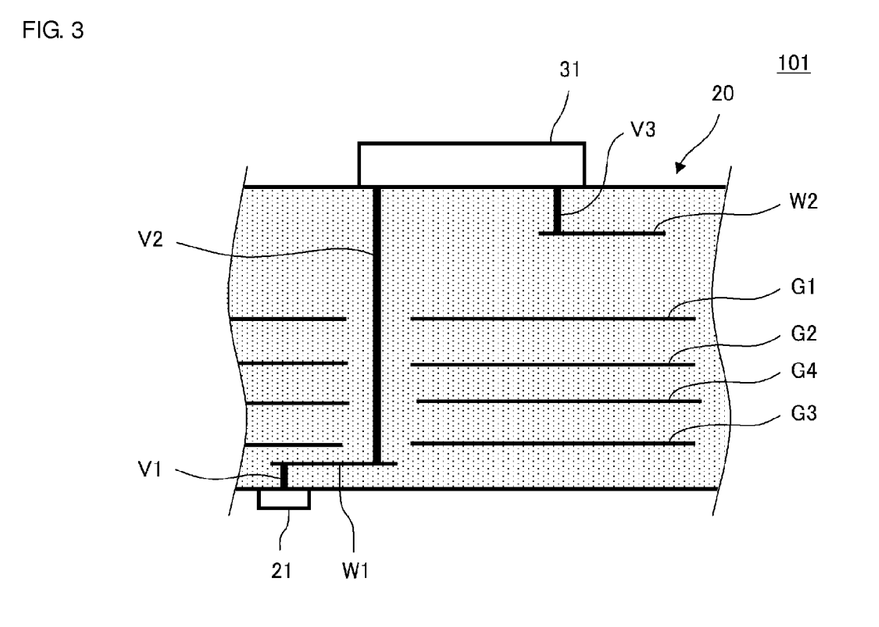
FIG. 3 is sectional view of the major portions of a high-frequency module 101 of the first preferred embodiment of the present invention.

FIG. 2A and FIG. 2B are sectional views of the major portions of high-frequency modules 100A and 100B, which are comparative examples (based on existing general design methods) of a high-frequency module of a first preferred embodiment of the present invention. FIG. 3 is sectional view of the major portions of a high-frequency module 101 of the first preferred embodiment.

In FIG. 2A, FIG. 2B, and FIG. 3, the high-frequency modules (100A, 100B, and 101) each include a multilayer ceramic substrate (hereinafter, simply called a "multilayer substrate") and a high-frequency switch 31 mounted on a first main surface (top surface) of the multilayer substrate 20. The multilayer substrate 20 includes therein wiring conductors W1 and W2, ground conductors G1, G2, and G3, and interlayer connection conductors V1, V2, and V3. A control signal input terminal 21 is located on the second main surface (bottom surface) of the multilayer substrate 20.

Respective electrodes on which the high-frequency switch 31 is mounted are electrically connected to the wiring conductors W1 and W2 through the interlayer connection conductors V2 and V3.

A control signal for the high-frequency switch 31 is input to the control signal input terminal 21. This control signal is input to the control signal input terminal of the high-frequency switch 31 through the interlayer connection conductor V1, the wiring conductor W1, and the interlayer connection conductor V2.

In either of the examples of FIG. 2A and FIG. 2B, the control signal wiring conductor W1 and the wiring conductor W2 through which a high-frequency signal of the high-frequency switch flows are close to the layer of the ground conductor G1. Unless the ground conductor G1 has a perfect ground potential and a very low resistance, the control signal wiring conductor W1 is coupled to the wiring conductor W2 through the layer of the ground conductor G1. In other words, as respectively indicated by an arrow and arrows in FIG. 2A and FIG. 2B, the control signal leaks to the wiring conductor W2 through which the high-frequency signal of the high-frequency switch 31 flows. As a result, harmonic noise of the control signal is superimposed on the high-frequency signal. This causes a decrease in reception sensitivity when the high-frequency signal is a reception signal, and causes distortion in a transmission signal when the high-frequency signal is the transmission signal.

On the other hand, in the high-frequency module 101 of the first preferred embodiment illustrated in FIG. 3, the control signal wiring conductor W1 is located on a dielectric layer close to the second main surface (bottom surface) of the multilayer substrate 20 and the high-frequency signal wiring conductor W2 through which a high-frequency signal of the high-frequency switch 31 flows is located on a dielectric layer close to the first main surface (top surface) of the multilayer substrate 20. Hence, the control signal wiring conductor W1 and the high-frequency signal wiring conductor W2 are spaced apart from each other.

Further, in this example, another ground electrode layer, such as a ground electrode G4, is located between the control signal wiring conductor W1 and the wiring conductor W2. Hence, coupling between the control signal wiring conductor W1 and the wiring conductor W2 is sufficiently blocked.

Further, the interlayer connection conductor V2 connected to the control signal input terminal of the high-frequency switch 31 extends straight directly under a position where the high-frequency switch 31 is mounted, and the interlayer connection conductor V2 electrically connecting the high-frequency switch 31 to the control signal wiring conductor W1 is located within the region of the high-frequency switch 31 when the multilayer substrate 20 is viewed in plan. Hence, routing length of a control signal conductor near the position where the high-frequency switch 31 is mounted is reduced and leakage of a control signal to the high-frequency signal wiring conductor W2 is reduced.

As a result of these effects, superimposition of a control signal and the harmonics thereof on the high-frequency signal wiring conductor W2 is sufficiently suppressed or prevented. Hence, degradation of the communication characteristics, such as a decrease in reception sensitivity and transmission signal distortion, is reduced.

Second Preferred Embodiment

Figure 4:
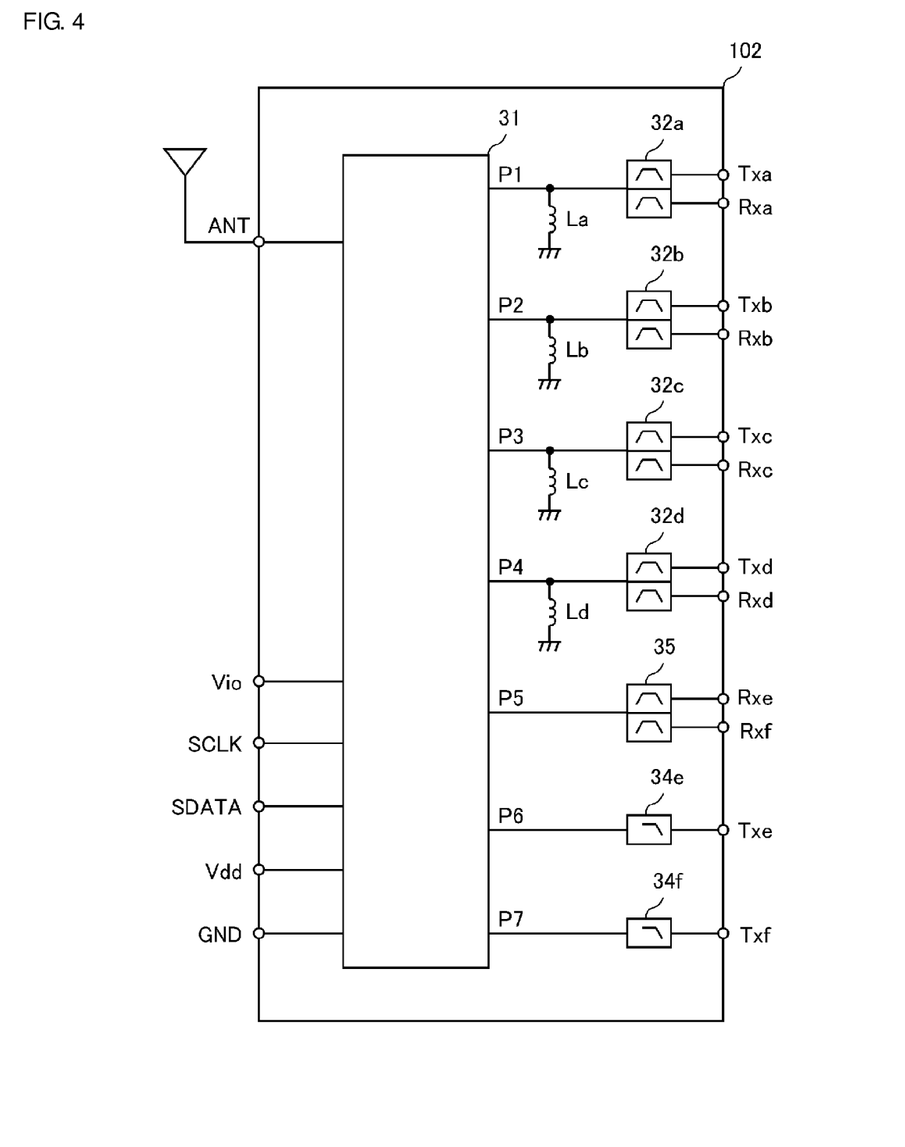
FIG. 4 is a block configuration diagram of a high-frequency module 102 of a second preferred embodiment of the present invention.

FIG. 4 is a block configuration diagram of a high-frequency module 102 of a second preferred embodiment of the present invention.

The high-frequency module 102 of the second preferred embodiment includes a multilayer substrate and includes a high-frequency switch 31, duplexers 32a to 32d, a diplexer 35, filters 34e and 34f, matching inductors La, Lb, Lc, and Ld, and the like mounted on the multilayer substrate. The high-frequency switch 31 includes an antenna port ANT, input/output ports P1 to P7, a power supply terminal Vdd, a ground terminal GND, a serial data input terminal SDATA, a clock signal input terminal SCLK, and a digital circuit portion power supply terminal Vio.

Figure 5:
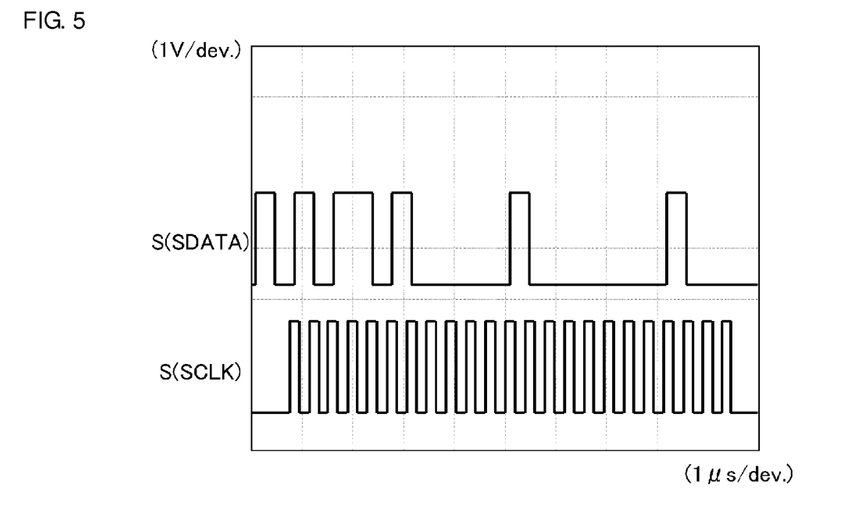
FIG. 5 is a waveform diagram illustrating a serial data signal S(SDATA) input to a serial data input terminal SDATA and a clock signal S(SCLK) input to a clock signal input terminal SCLK.

FIG. 5 is a waveform diagram illustrating a serial data signal S(SDATA) input to the serial data input terminal SDATA and a clock signal S(SCLK) input to the clock signal input terminal SCLK. The high-frequency switch 31 reads predetermined bits of data from serial data in synchronization with the clock signal S(SCLK). On the basis of this data, on/off of a high-frequency switch such as an FET is switched.

In this manner, since the serial data signal S(SDATA) and the clock signal S(SCLK) are rectangular wave signals, the strengths of the harmonic components are high. In addition, the clock signal S(SCLK), which is, for example, a 26 MHz continuous rectangular wave signal, is likely to be a cause of the above-described superimposition of harmonic noise.

Figure 6A:
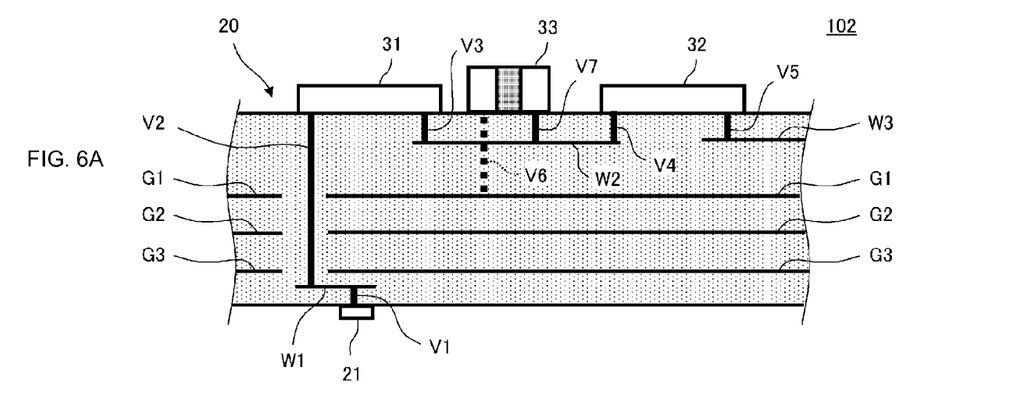
FIG. 6A is a sectional view of the major portions of a high-frequency module 102 of the second preferred embodiment of the present invention.
Figure 6B:
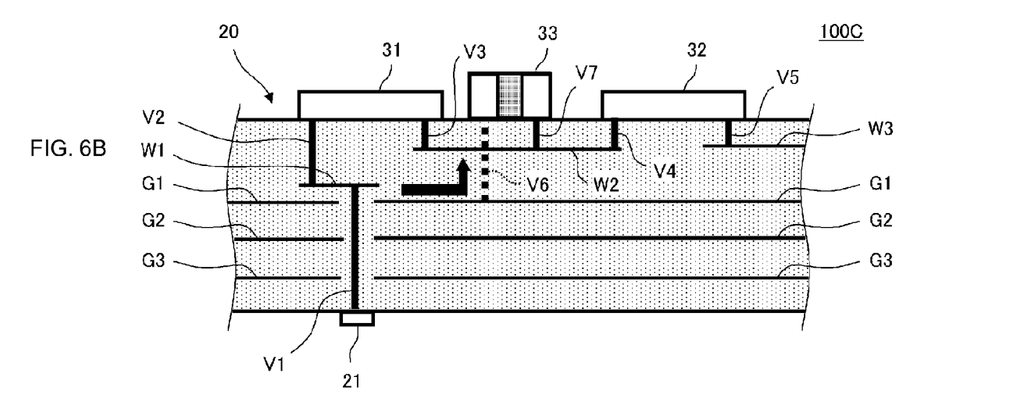
FIG. 6B is a sectional view of the major portions of a high-frequency module 100C having an existing configuration as a comparative example of the high-frequency module 102.

FIG. 6A is a sectional view of the major portions of the high-frequency module 102 of the second preferred embodiment, and FIG. 6B is a sectional view of the major portions of a high-frequency module 100C having an existing configuration as a comparative example of the high-frequency module 102.

In FIGS. 6A and 6B, the high-frequency modules (102, 100C) each include a multilayer substrate 20 and a high-frequency switch 31, a duplexer 32, a matching inductor 33, and the like which are mounted on a first main surface (top surface) of the multilayer substrate 20. The multilayer substrate 20 includes therein wiring conductors W1 to W3, ground conductors G1 to G3, interlayer connection conductors V1 to V7. A control signal input terminal 21 is located on the second main surface (bottom surface) of the multilayer substrate 20.

Respective electrodes on which the high-frequency switch 31 is mounted are electrically connected to the wiring conductors W1 and W2 through the interlayer connection conductors V2 and V3.

A control signal for the high-frequency switch 31 is input to the control signal input terminal 21. This control signal is input to the control signal input terminal of the high-frequency switch 31 through the interlayer connection conductor V1, the wiring conductor W1, and the interlayer connection conductor V2. One terminal of the matching inductor 33 is connected to the ground conductor G1 through the interlayer connection conductor V6, and the other terminal is connected to the wiring conductor W2. One terminal of the duplexer 32 is connected to the wiring conductor W2 through the interlayer connection conductor V4, and the other terminal is connected to the wiring conductor W3.

In the example illustrated in FIG. 6B, the layer of the wiring conductor (high-frequency signal wiring conductor) W2 through which a high-frequency signal of the high-frequency switch flows is close to the layer of the ground conductor G1 to which the matching inductor 33 is electrically connected. Hence, as indicated by an arrow in FIG. 6B, harmonic noise of the control signal is superimposed on the matching device conduction ground conductor G1 connected to the matching inductor 33. This harmonic noise of the control signal leaks to the high-frequency signal wiring conductor W2 through the matching inductor 33. As a result, the harmonic noise of the control signal is superimposed on a high-frequency signal. This causes a decrease in reception sensitivity when the high-frequency signal is a reception signal, and causes distortion in a transmission signal when the high-frequency signal is the transmission signal.

On the other hand, in the second preferred embodiment of the present invention, the control signal wiring conductor W1 is located on a dielectric layer close to a second surface (bottom surface) of the multilayer substrate 20 as illustrated in FIG. 6A, and the high-frequency signal wiring conductor W2 through which the high-frequency signal of the high-frequency switch 31 flows and the matching device conduction ground conductor G1 are located on dielectric layers close to the first main surface (top surface) of the multilayer substrate 20. Hence, the control signal wiring conductor W1 and the high-frequency signal wiring conductor W2 are spaced apart from each other. In addition, the control signal wiring conductor W1 and the matching device conduction ground conductor G1 are spaced apart from each other.

Further, in this example, ground conductor layers G2, G3, and the like other than the matching device conduction ground conductor G1 are located between the control signal wiring conductor W1 and the matching device conduction ground conductor G1. Hence, coupling between the control signal wiring conductor W1 and the matching device conduction ground conductor G1 is sufficiently blocked.

Further, the interlayer connection conductor V2 connected to the control signal input terminal of the high-frequency switch 31 extends straight directly under a position where the high-frequency switch 31 is mounted, and the interlayer connection conductor V2 electrically connecting the high-frequency switch 31 to the control signal wiring conductor W1 is located within the region of the high-frequency switch 31 when the multilayer substrate 20 is viewed in plan. Hence, routing length of a control signal conductor near the position where the high-frequency switch 31 is mounted is reduced and leakage of the control signal to the matching device conduction ground conductor G1 and the high-frequency signal wiring conductor W2 is reduced.

As a result of these effects, superimposition of a control signal and the harmonics thereof on the high-frequency signal wiring conductor W2 is sufficiently suppressed or prevented. Hence, degradation of the communication characteristics, such as a decrease in reception sensitivity and transmission signal distortion, is reduced.

Third Preferred Embodiment

Figure 7A:
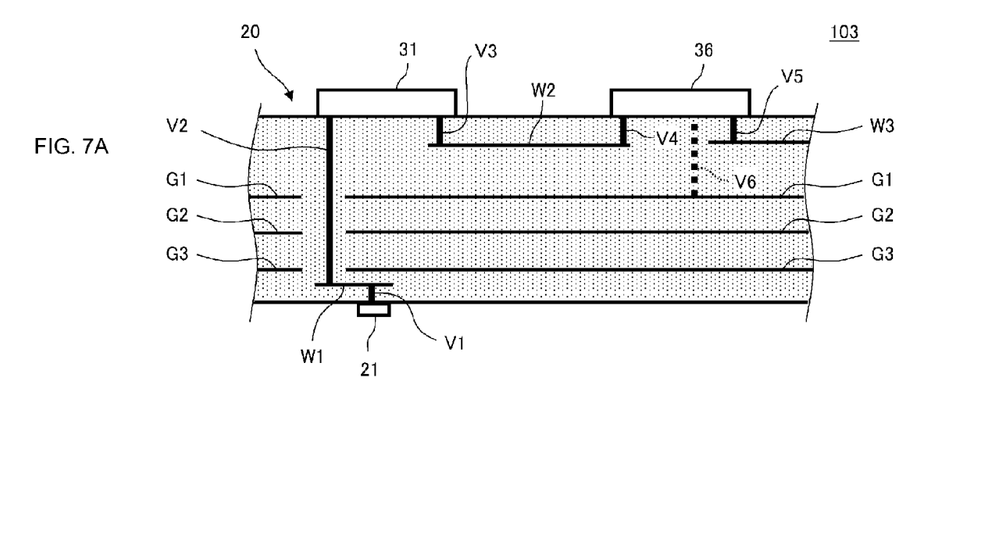
FIG. 7A is a sectional view of the major portions of a high-frequency module 103 of a third preferred embodiment of the present invention.
Figure 7B:
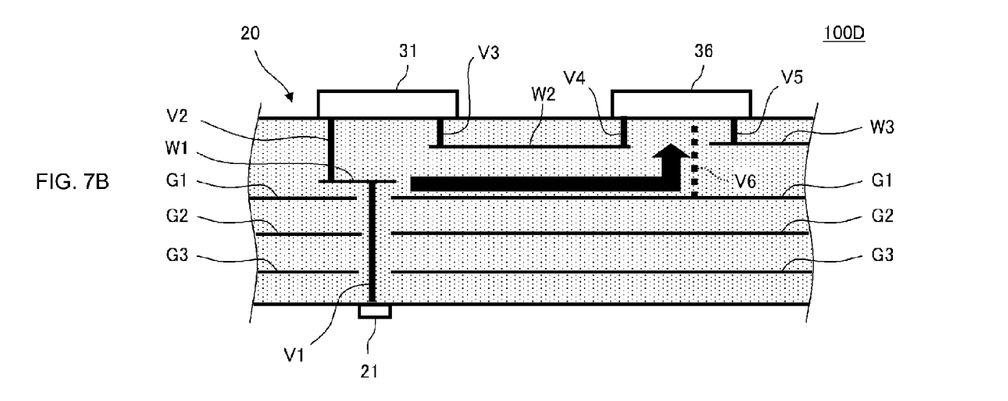
FIG. 7B is a sectional view of the major portions of a high-frequency module 100D having an existing configuration as a comparative example of the high-frequency module 103.

FIG. 7A is a sectional view of the major portions of a high-frequency module 103 of a third preferred embodiment of the present invention, and FIG. 7B is a sectional view of the major portions of a high-frequency module 100D having an existing configuration as a comparative example of the high-frequency module 103.

In FIGS. 7A and 7B, the high-frequency module (103, 100D) each include a multilayer substrate 20 and include a high-frequency switch 31, an electronic component 36, and the like which are mounted on a first main surface (top surface) of the multilayer substrate 20. The multilayer substrate 20 includes therein wiring conductors W1 to W3, ground conductors G1 to G3, and interlayer connection conductors V1 to V6. A control signal input terminal 21 is located on the second main surface (bottom surface) of the multilayer substrate 20.

Respective electrodes on which the high-frequency switch 31 is mounted are electrically connected to the wiring conductors W1 and W2 through the interlayer connection conductors V2 and V3.

A control signal for the high-frequency switch 31 is input to the control signal input terminal 21. This control signal is input to the control signal input terminal of the high-frequency switch 31 through the interlayer connection conductor V1, the wiring conductor W1, and the interlayer connection conductor V2. The ground terminal of the electronic component 36 is connected to the ground conductor (electronic component conduction ground conductor) G1 through the interlayer connection conductor V6, and the other terminals are connected to the wiring conductors W2 and W3.

In the example illustrated in FIG. 7B, the layer of the wiring conductor (high-frequency signal wiring conductor) W2 through which a high-frequency signal of the high-frequency switch flows is close to the layer of the ground conductor G1 to which the electronic component 36 is electrically connected. Hence, as indicated by an arrow in FIG. 7B, harmonic noise of the control signal is superimposed on the electronic component conduction ground conductor G1 connected to the electronic component 36. This harmonic noise of the control signal leaks to the high-frequency signal wiring conductors W2 and W3 through the electronic component 36. As a result, the harmonic noise of the control signal is superimposed on a high-frequency signal. This causes a decrease in reception sensitivity when the high-frequency signal is a reception signal, and causes distortion in a transmission signal when the high-frequency signal is the transmission signal.

On the other hand, in the third preferred embodiment of the present invention, the control signal wiring conductor W1 is located on a dielectric layer close to a second surface (bottom surface) of the multilayer substrate 20 as illustrated in FIG. 7A, and the high-frequency signal wiring conductor W2 through which the high-frequency signal of the high-frequency switch 31 flows and the ground conductor (electronic component conduction ground conductor) G1 which is electrically connected to the electronic component 36 are mounted on a dielectric layer close to the first main surface (top surface) of the multilayer substrate 20. Hence, the control signal wiring conductor W1 and the high-frequency signal wiring conductor W2 are spaced apart from each other. In addition, the control signal wiring conductor W1 and the electronic component conduction ground conductor G1 are spaced apart from each other.

Further, in this example, ground conductor layers G2, G3, and the like other than the electronic component conduction ground conductor G1 are located between the control signal wiring conductor W1 and the electronic component conduction ground conductor G1. Hence, coupling between the control signal wiring conductor W1 and the electronic component conduction ground conductor G1 is sufficiently blocked.

Further, the interlayer connection conductor V2 connected to the control signal input terminal of the high-frequency switch 31 extends straight directly under a position where the high-frequency switch 31 is mounted, and the interlayer connection conductor V2 electrically connecting the high-frequency switch 31 to the control signal wiring conductor W1 is formed within the region of the high-frequency switch 31 when the multilayer substrate 20 is viewed in plan. Hence, routing length of a control signal conductor near the position where the high-frequency switch 31 is mounted is reduced and leakage of the control signal to the electronic component conduction ground conductor G1 and the high-frequency signal wiring conductor W2 is reduced.

As a result of these effects, superimposition of a control signal and the harmonics thereof on the high-frequency signal wiring conductor W2 is sufficiently suppressed or prevented. Hence, degradation of the communication characteristics, such as a decrease in reception sensitivity and transmission signal distortion, is reduced.

Fourth Preferred Embodiment

Figure 8A:
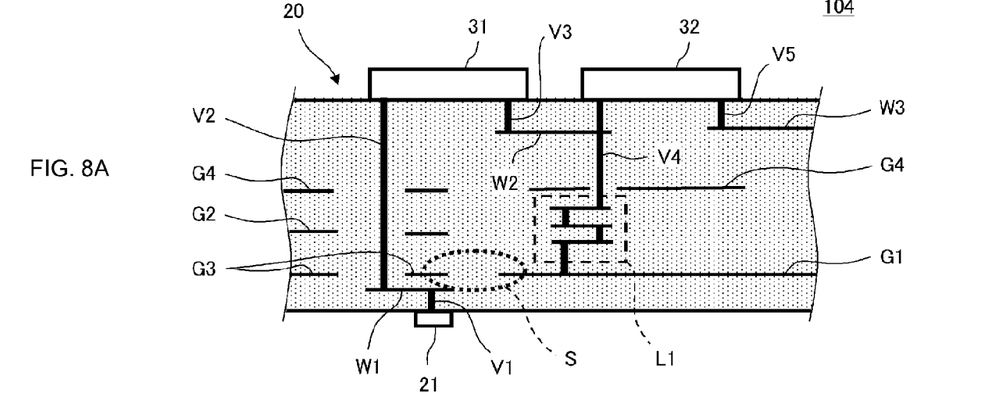
FIG. 8A is a sectional view of the major portions of a high-frequency module 104 of a fourth preferred embodiment of the present invention.
Figure 8B:
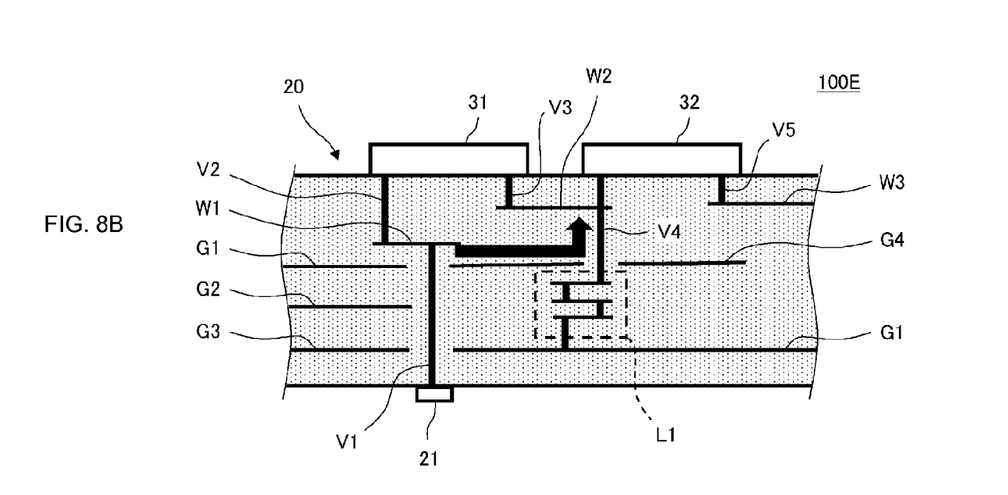
FIG. 8B is a sectional view of the major portions of a high-frequency module 100E having an existing configuration as a comparative example of the high-frequency module 103.

FIG. 8A is a sectional view of the major portions of a high-frequency module 104 of a fourth preferred embodiment of the present invention, and FIG. 8B is a sectional view of the major portions of a high-frequency module 100E having an existing configuration as a comparative example of the high-frequency module 103.

In FIGS. 8A and 8B, the high-frequency modules (104, 100E) each include a multilayer substrate 20 and include a high-frequency switch 31, a duplexer 32, and the like which are mounted on a first main surface (top surface) of the multilayer substrate 20. The multilayer substrate 20 includes therein wiring conductors W1 to W3, ground conductors G1 to G4, interlayer connection conductors V1 to V5, and a matching inductor L1. A control signal input terminal 21 is located on the second main surface (bottom surface) of the multilayer substrate 20.

Respective electrodes on which the high-frequency switch 31 is mounted are electrically connected to the wiring conductors W1 and W2 through the interlayer connection conductors V2 and V3.

Unlike the high-frequency modules having the configurations illustrated in FIG. 6A and FIG. 6B, the matching inductor L1 is located within the multilayer substrate 20. The matching inductor L1 preferably includes a plurality of wiring conductors extending in the in-plane direction of the layers and a plurality of interlayer connection conductors extending in the interlayer direction. One end of the matching inductor L1 is connected to the high-frequency signal wiring conductor W2, and the other end is connected to the matching device conduction ground conductor G1.

In the example of FIG. 8B, the control signal wiring conductor W1 and the high-frequency signal wiring conductor W2 are close to the layer of the ground electrode G4. Hence, as indicated by an arrow in FIG. 8B, harmonic noise of the control signal is superimposed on the high-frequency signal wiring conductor W2 through the ground electrode G4. As a result, the harmonic noise of the control signal is superimposed on a high-frequency signal. This causes a decrease in reception sensitivity when the high-frequency signal is a reception signal, and causes distortion in a transmission signal when the high-frequency signal is the transmission signal.

On the other hand, in the fourth preferred embodiment of the present invention, the control signal wiring conductor W1 is located on a dielectric layer close to a second surface (bottom surface) of the multilayer substrate 20 as illustrated in FIG. 8A, and the high-frequency signal wiring conductor W2 is located on a dielectric layer close to the first main surface (top surface) of the multilayer substrate 20. Hence, the control signal wiring conductor W1 and the high-frequency signal wiring conductor W2 are spaced apart from each other.

Further, in this example, the ground conductor layer G3 which is superposed with the control signal wiring conductor W1 in plan view is separated from the matching device conduction ground conductor G1 by a separation portion S. Hence, coupling between the control signal wiring conductor W1 and the matching device conduction ground conductor G1 is sufficiently blocked.

Further, the interlayer connection conductor V2 connected to the control signal input terminal of the high-frequency switch 31 extends straight directly under a position where the high-frequency switch 31 is mounted, and the interlayer connection conductor V2 electrically connecting the high-frequency switch 31 to the control signal wiring conductor W1 is located within the region of the high-frequency switch 31 when the multilayer substrate 20 is viewed in plan. Hence, routing length of a control signal conductor near the position where the high-frequency switch 31 is mounted is reduced and leakage of the control signal to the high-frequency signal wiring conductor W2 is reduced.

As a result of these effects, superimposition of a control signal and the harmonics thereof on the high-frequency signal wiring conductor W2 is sufficiently suppressed or prevented. Hence, degradation of the communication characteristics, such as a decrease in reception sensitivity and transmission signal distortion, is reduced.

Fifth Preferred Embodiment

Figure 9:
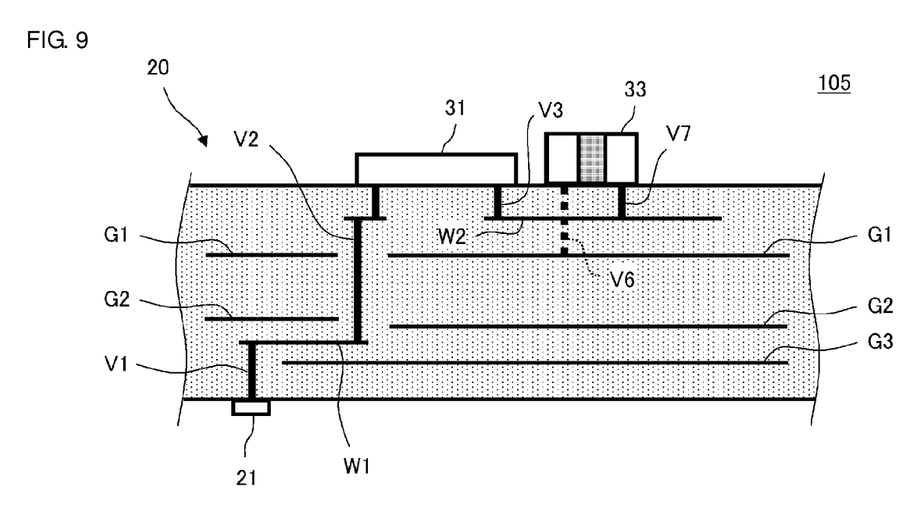
FIG. 9 is a sectional view of a high-frequency module 105 of a fifth preferred embodiment of the present invention.
Figure 10:
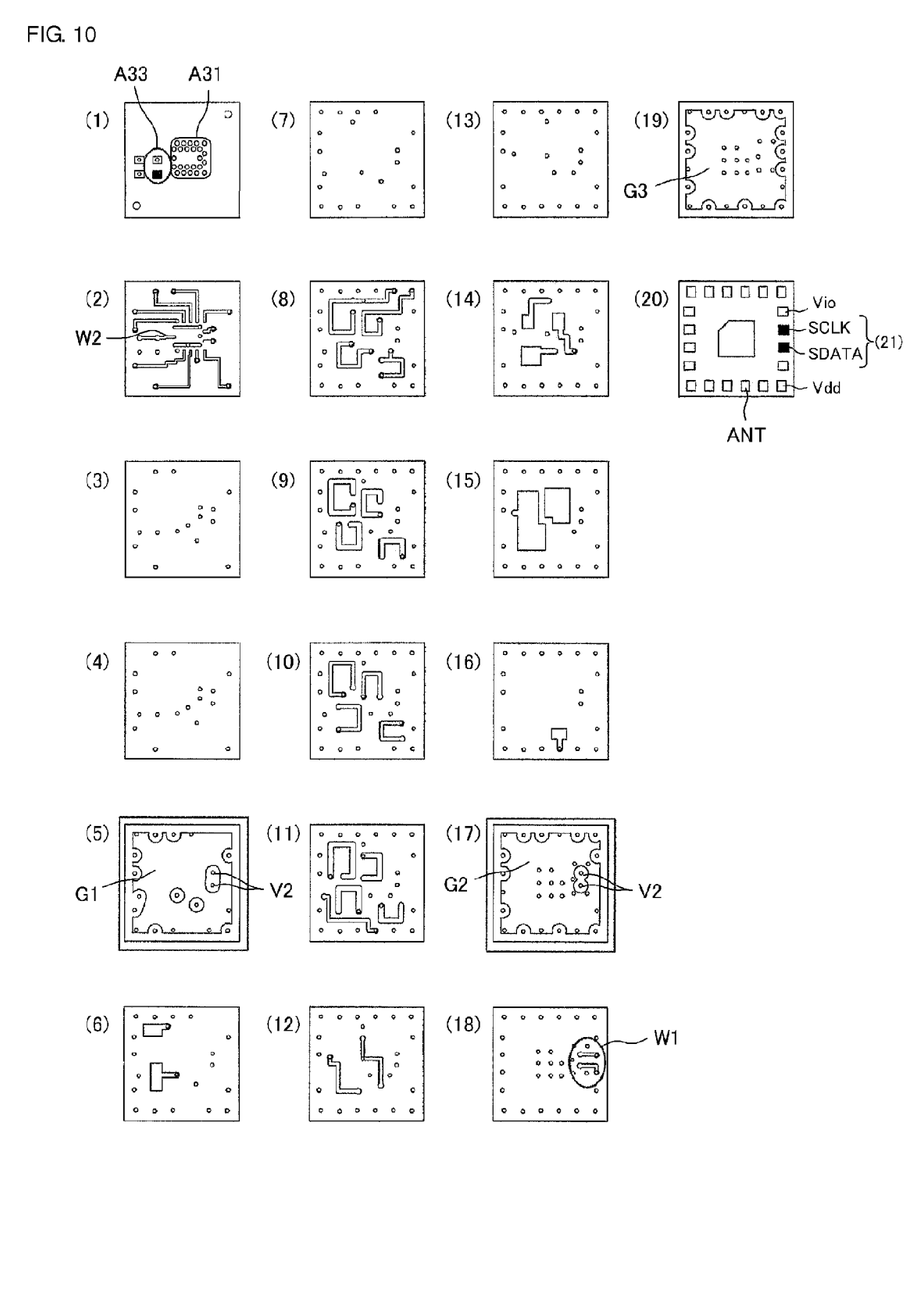
FIG. 10 is an exploded plan view of the high-frequency module 105.

FIG. 9 is a sectional view of a high-frequency module 105 of a fifth preferred embodiment of the present invention. FIG. 10 is an exploded plan view of the high-frequency module 105. This high-frequency module includes a multilayer substrate and includes a high-frequency switch and a matching inductor which are mounted on the multilayer substrate. In FIG. 10, (1) to (20) are plan views of the layers of the multilayer substrate. (1) is the uppermost layer and (20) is the lowermost layer. On the uppermost layer illustrated in (1), electrodes on which the high-frequency module is mounted and electrodes on which the matching inductor chip is mounted are provided. Various wiring conductors, various ground conductors, and interlayer connection conductors (via conductors) are provided on the layers illustrated in (2) to (19).

Referring to FIG. 9, the multilayer substrate 20 includes therein wiring conductors W1 and W2, ground conductors G1 to G3, interlayer connection conductors V1, V2, V3, V6, and V7. Control signal input terminals 21 are provided on a second main surface (bottom surface) of the multilayer substrate 20. The basic configuration is similar to that illustrated in FIG. 6A of the second preferred embodiment.

Respective electrodes on which a high-frequency switch 31 is mounted are electrically connected to the wiring conductors W1 and W2 through the interlayer connection conductors V2 and V3.

The control signal wiring conductor W1 is provided on a dielectric layer close to the second main surface (bottom surface) of the multilayer substrate 20, and the high-frequency signal wiring conductor W2 through which a high-frequency signal of the high-frequency switch 31 flows and the matching device conduction ground conductor G1 are provided on a dielectric layer close to the first main surface (top surface) of the multilayer substrate 20. Hence, the control signal wiring conductor W1 and the high-frequency signal wiring conductor W2 are spaced apart from each other. Further, the control signal wiring conductor W1 and the matching device conduction ground conductor G1 are spaced apart from each other.

A plurality of terminals including the control signal input terminals 21 (a serial data input terminal SDATA and a clock signal input terminal SCLK) are provided on the layer (20) of FIG. 10. The ground conductor G3 is provided on the layer (19). The control signal wiring conductor W1 connected to the control signal input terminal 21 is provided on the layer (18). The ground conductor G2 is formed on the layer (17). The ground conductor G1 is provided on the layer (5). The high-frequency signal wiring conductor W2 is provided on the layer (2). Further, a plurality of electrodes A31 on which the high-frequency switch 31 are mounted and two electrodes A33 on which the matching inductor 33 is mounted are provided on the layer (1). The layer (3) to the layer (19) have the interlayer connection conductors V2 provided therein.

In this manner, the multilayer structure is provided, for example.

Sixth Preferred Embodiment

Figure 11:
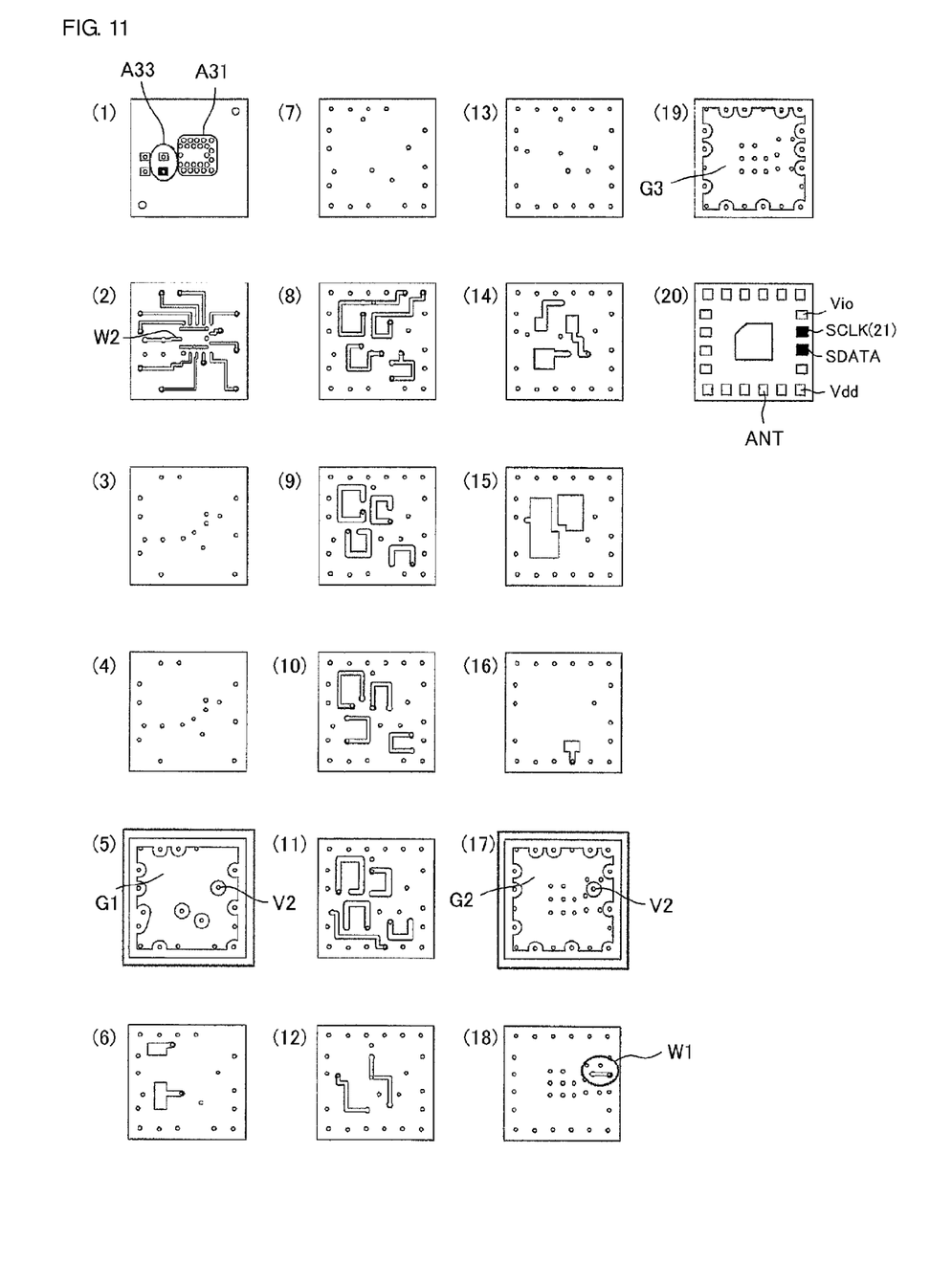
FIG. 11 is an exploded plan view of a high-frequency module of a sixth preferred embodiment of the present invention.

FIG. 11 is an exploded plan view of a high-frequency module of a sixth preferred embodiment of the present invention. The fifth preferred embodiment preferably includes a structure in which leakage of harmonic noise from respective wiring conductors and respective interlayer connection conductors connected to the serial data input terminal SDATA and the clock signal input terminal SCLK is prevented. The sixth preferred embodiment preferably includes a structure in which leakage of harmonic noise from a wiring conductor and an interlayer conductor connected to the clock signal input terminal SCLK is prevented. The rest of the structure is the same as that of the fifth preferred embodiment.

A plurality of terminals including the serial data input terminal SDATA and the clock signal input terminal SCLK (control signal input terminal 21) are provided on a layer (20) illustrated in FIG. 11. A layer (19) includes a ground conductor G3 provided thereon. A control signal wiring conductor W1 connected to the clock signal input terminal SCLK (control signal input terminal 21) is provided on a layer (18). A layer (17) includes a ground conductor G2 provided thereon. A layer (5) includes a ground conductor G1 provided thereon. A layer (2) includes a wiring conductor W2 provided thereon. Further, a plurality of electrodes A31 for mounting a high-frequency switch 31 and two electrodes A33 that mount a matching inductor 33 are provided on a layer (1). An interlayer connection conductor V2 is provided in a layer (3) to the layer (19).

In this manner, even when the structure illustrated in FIG. 9 is used only for the wiring conductor and interlayer conductor connected to the clock signal input terminal SCLK for the synchronized transfer of serial data, leakage of harmonic signals of a clock signal to the high-frequency signal wiring conductor W2 is sufficiently suppressed or prevented. As a result, degradation of the communication characteristics, such as a decrease in reception sensitivity and transmission signal distortion, is reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
    a multilayer substrate including a plurality of dielectric layers, wiring conductors located on the dielectric layers, and interlayer connection conductors extending through the dielectric layers in a thickness direction;
    a high-frequency switch and an electronic component mounted on a first main surface of the multilayer substrate; and
    a control signal input terminal that is located on a second main surface of the multilayer substrate and that receives a control signal for the high-frequency switch; wherein
    a control signal wiring conductor connected to the control signal input terminal and located on of the dielectric layers adjacent to the second main surface of the multilayer substrate;
    a high-frequency signal wiring conductor through which a high-frequency signal of the high-frequency switch flows is located on one of the dielectric layers adjacent to the first main surface of the multilayer substrate; and
    the control signal for the high-frequency switch received by the high-frequency switch from the control signal input terminal includes a serial data signal and a clock signal.

2. The high-frequency module according to claim 1, wherein an electronic component conduction ground conductor connected to a ground terminal of the electronic component is located on the one of the dielectric layers adjacent to the first main surface of the multilayer substrate.

3. The high-frequency module according to claim 2, wherein a ground conductor adjacent to the control signal wiring conductor and the electronic component conduction ground conductor are electrically separated from each other within the multilayer substrate.

4. The high-frequency module according to claim 2, wherein another ground conductor other than the electronic component conduction ground conductor is provided between the control signal wiring conductor and the electronic component conduction ground conductor.

5. The high-frequency module according to claim 1, wherein an interlayer connection conductor electrically connecting the high-frequency switch to the control signal wiring conductor is located in a region of the high-frequency switch when the multilayer substrate is viewed in plan.

6. The high-frequency module according to claim 5, wherein the interlayer connection conductor is located within a region of the high-frequency switch when the multilayer substrate is viewed in plan.

7. The high-frequency module according to claim 1, further comprising a plurality of duplexers, a diplexer, a plurality of filters, a plurality of matching inductors mounted on the multilayer substrate.

8. The high-frequency module according to claim 1, wherein the electronic component is a matching device connected between the high-frequency signal wiring conductor and ground.

9. The high-frequency module according to claim 8, wherein the matching device includes an inductor device including an interlayer connection conductor and a wiring conductor within the multilayer substrate.

10. The high-frequency module according to claim 8, wherein the matching device includes an inductor device mounted on the first main surface of the multilayer substrate.

11. The high-frequency module according to claim 1, further comprising an interlayer connection conductor connected to the control signal input terminal of the high-frequency switch.

12. The high-frequency module according to claim 11, wherein the interlayer connection conductor extends straight directly under a position where the high-frequency switch is mounted.

13. The high-frequency module according to claim 1, further comprising an electronic component conduction ground conductor and a plurality of ground conductor layers located between the control signal wiring conductor and the electronic component conduction ground conductor.

14. The high-frequency module according to claim 13, further comprising a matching device located within the multilayer substrate, wherein one of the ground conductor layers that is superposed with the control signal wiring conductor in plan view is separated from a matching device conduction ground conductor by a separation portion.

15. The high-frequency module according to claim 14, wherein the control signal wiring conductor and the high-frequency signal wiring conductor are spaced apart from each other, and the control signal wiring conductor and the matching device conduction ground conductor are spaced apart from each other.

16. The high-frequency module according to claim 1, further comprising a matching inductor located within the multilayer substrate including a plurality of wiring conductors extending in an in-plane direction of the dielectric layers and a plurality of interlayer connection conductors extending in an interlayer direction.

17. A high-frequency module comprising:
a multilayer substrate including a plurality of dielectric layers, wiring conductors located on the dielectric layers, and interlayer connection conductors extending through the dielectric layers in a thickness direction;
a high-frequency switch and an electronic component mounted on a first main surface of the multilayer substrate; and
a control signal input terminal that is located on a second main surface of the multilayer substrate and that receives a control signal for the high-frequency switch; wherein
a control signal wiring conductor connected to the control signal input terminal and located on of the dielectric layers adjacent to the second main surface of the multilayer substrate;
a high-frequency signal wiring conductor through which a high-frequency signal of the high-frequency switch flows is located on one of the dielectric layers adjacent to the first main surface of the multilayer substrate; and
the high-frequency switch includes an antenna port, a plurality of input/output ports, a power supply terminal, a ground terminal, a serial data input terminal, a clock signal input terminal, and a digital circuit portion power supply terminal.

18. The high-frequency module according to of claim 17, wherein the control signal for the high-frequency switch received by the high-frequency switch from the control signal input terminal includes a serial data signal and a clock signal.

19. A high-frequency module comprising:
a multilayer substrate including a plurality of dielectric layers, wiring conductors located on the dielectric layers, and interlayer connection conductors extending through the dielectric layers in a thickness direction;
a high-frequency switch and an electronic component mounted on a first main surface of the multilayer substrate; and
a control signal input terminal that is located on a second main surface of the multilayer substrate and that receives a control signal for the high-frequency switch; wherein
a control signal wiring conductor connected to the control signal input terminal and located on of the dielectric layers adjacent to the second main surface of the multilayer substrate;
a high-frequency signal wiring conductor through which a high-frequency signal of the high-frequency switch flows is located on one of the dielectric layers adjacent to the first main surface of the multilayer substrate; and
a serial data input terminal and a clock signal input terminal define the control signal input terminal and are provided on a common one of the dielectric layers.

20. The high-frequency module according to claim 19, further comprising a control signal wiring conductor connected to the clock signal input terminal defining the control signal input terminal provided on another one of the dielectric layers, and a plurality of electrodes to mount the high-frequency switch and a plurality of electrodes to mount a matching inductor are provided on an additional one of the dielectric layers.

* * * * *